(12) United States Patent  (10) Patent No.: US 8,553,426 B2
Huang  (45) Date of Patent: Oct. 8, 2013

(54) CIRCUIT BOARD WITH HIGHER CURRENT

(75) Inventor: Tsung-Sheng Huang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 185 days.

(21) Appl. No.: 13/304,415

(22) Filed: Nov. 25, 2011

(65) Prior Publication Data

US 2013/0050968 A1  Feb. 28, 2013

(30) Foreign Application Priority Data

Aug. 31, 2011 (TW) .............................. 100131400 A

(51) Int. Cl.
*H05K 7/00* (2006.01)
(52) U.S. Cl.
USPC ......................................................... 361/783
(58) Field of Classification Search
USPC .................................. 361/783, 760, 748, 761
See application file for complete search history.

(56) References Cited

U.S. PATENT DOCUMENTS

| 5,745,334 | A  | * | 4/1998 | Hoffarth et al. | 361/313 |
| 8,385,079 | B2 | * | 2/2013 | Choi et al. | 361/783 |
| 8,446,734 | B2 | * | 5/2013 | Hayashi et al. | 361/783 |

* cited by examiner

*Primary Examiner* — Timothy Thompson
*Assistant Examiner* — Andargie M Aychillhum
(74) *Attorney, Agent, or Firm* — Altis & Wispro Law Group, Inc.

(57) ABSTRACT

A circuit board includes a plurality of conductive layers, at least one group of vias, a number of second vias, at least one power supply element, and at least one electronic element. Each conductive layer includes a conductive portion. Both the first vias and the second vias are defined through the conductive layers and electrically connected each conductive layers. The at least one group of first vias surrounds the at least one power supply element. The second vias are arranged along the side of the conductive portion, and positioned between the power supply element and the electronic element. Current from a power supply element flows to the inner conductive layers through the group of surrounding first vias. Current transmission on each conductive layer continuously flows to another conductive layer having a lower resistance through the second vias during transmission.

9 Claims, 2 Drawing Sheets

CIRCUIT BOARD WITH HIGHER CURRENT

BACKGROUND

1. Technical Field

The disclosure generally relates to circuit boards, and particularly to a multilayer circuit board with an even current distribution and relatively higher current transmission efficiency.

2. Description of Related Art

A typical circuit board usually includes a plurality of conductive layers made of copper foil and a plurality of vias defined in the conductive layer to electrically connect the conductive layers. A voltage regulator module can provide electrically power to the circuit board by a plurality of power supply elements such as output choke coils. The power supply elements outputs current to an electronic element, such as a processor mounted to the circuit board by the vias and the conductive layers.

However, when the distribution of the vias arranged on the circuit board is irregular, current flowing through each via is different, which causes the current distribution of the circuit board uneven. Thus, the circuit board may be damaged by overheating in the areas with more current and have a shorter lifespan.

In addition, because the upper conductive layers transmits higher current than the lower conductive layers, the total number of the vias arranged on the circuit board needs to be enough to enable each conductive layer to transmit a even current, which may increase impedance of the circuit board and lead to a lower current transmission efficiency.

Therefore, there is room for improvement within the art.

BRIEF DESCRIPTION OF THE DRAWINGS

Many aspects of the present disclosure can be better understood with reference to the following drawings. The elements in the drawings are not necessarily drawn to scale, the emphasis instead being placed upon clearly illustrating the principles of the disclosure.

DETAILED DESCRIPTION

Figure 1:
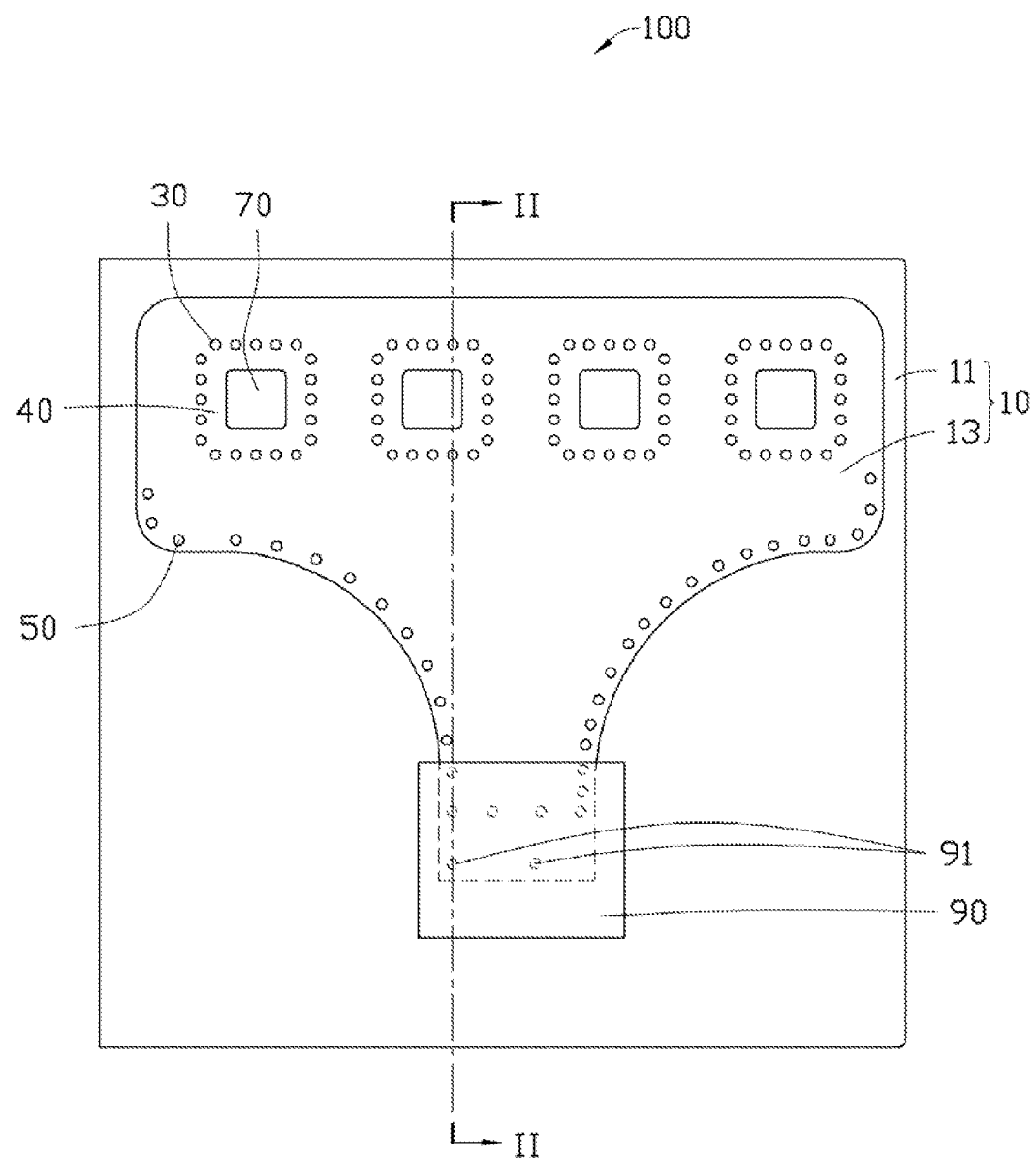
FIG. 1 is a schematic view of a circuit board, according to an exemplary embodiment of the disclosure.

FIG. 1 is a schematic view of a circuit board 100, according to an exemplary embodiment of the disclosure. The circuit board 100 includes a plurality of conductive layers 10, a plurality of groups of first vias 30, a plurality of second vias 50, a plurality of power supply elements 70, and an electronic element 90. The power supply elements 70 and the electronic element 90 are mounted on the circuit board 100. Both the first vias 30 and the second vias 50 extend through all the conductive layers 10. The power supply elements 70 provide electrical power to the electronic element 90 through the conductive layers 10, the first vias 30, and the second vias 50.

The conductive layers 10 are spacedly positioned, and parallel to each other. The conductive layers 10 may be signal layers or power supply layers. Each conductive layer 10 includes a main body 11 and a conductive portion 13 embedded in the main body 11. In the exemplary embodiment, the main bodies 11 can be made of insulated material, and the conductive portions 13 can be copper foil layers. Due to the different shapes of the conductive portions 13, each conductive portion 13 may have different resistances. The surface conductive portion 13 electronically connects to both the power supply elements 70 and the electronic element 90, and all the conductive portions 13 transmit current from the power supply element 70 to the electronic element 90.

Figure 2:
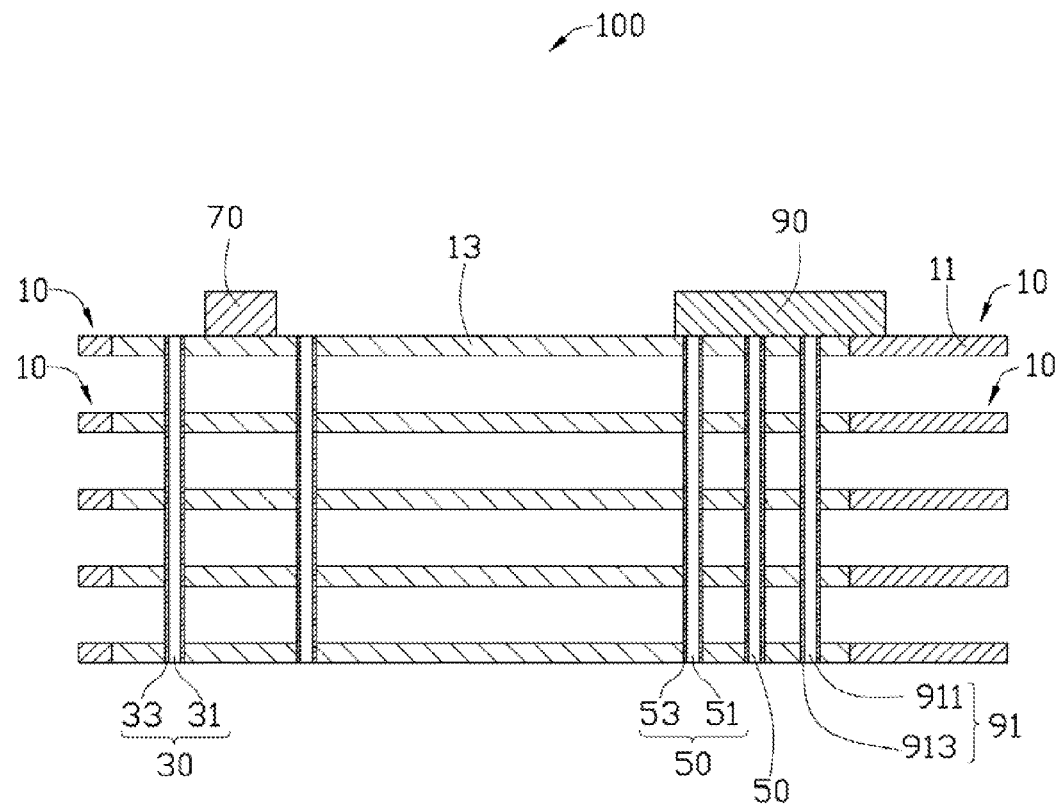
FIG. 2 is a cross-sectional view of the circuit board, taken along line II-II of FIG. 1.

Referring to FIG. 2, each first via 30 includes a first through hole 31 and a first conductive inner wall 33. The first conductive inner wall 33 is plated on an inner surface of each first through hole 31. Thus, parts of each the conductive layers 10 facing the power supply element 70 can be electrically connected by the first conductive inner walls 33.

In this exemplary embodiment, each group of the first vias 30 is arranged surrounding each power supply element 70 to form a current flowing region 40 on each conductive layer 10. A shape of the current flowing region 40 corresponds to a profile of the power supply element 70. In exemplary embodiment, the current flowing region 40 is rectangular. When the power supply elements 70 provide electrically power to the electronic element 90, current is output into the surface current flowing region 40 on the surface conductive layer 10. So that a first portion of the output current flows to the inner conductive layers 10 through the first vias 30, and a second portion of the output current still flows along the surface conductive layer 10. Thus, the current from the power supply elements 70 can be distributed into each conductive layer 10, and transmitted by all the conductive layers 10.

The number of each group of the first vias 30 surrounded each power supply element 40 can be changed according to a value of the current output from each power supply element 40 and a maximum value of the current flowing through each first via 30. In the illustrated embodiment, for example, when the value of the current output from each power supply element 70 is about 40 A, and the maximum current flowing through each via 30 is about 2.5 A, the number of each group of first vias 30 is about twenty.

The second vias 50 have the same structure as the first vias 30. Each second via 50 includes a second through hole 51 and a second conductive inner wall 53. Thus, parts of each conductive layer 10 between the power supply elements 70 and the electronic element 90 can be electrically connected to each other via the second conductive inner walls 53. In the exemplary embodiment, the second vias 50 are positioned between the power supply elements 70 and the electronic elements 90, and arranged along the peripheral edge of the conductive portion 13 so each conductive layer 10 has a lower resistance.

In this exemplary embodiment, the current from the power supply elements 70 is distributed to each conductive layer 10 through the first vias 30. Then the second vias 50 guide the current on each conductive portion 13 to continuously flow to a top/down conductive portion 13 having a lower resistance, until the current is transmitted to the electronic element 90. Thus, each conductive portion 13 will have a higher transmission speed and a lower transmission lost.

In an exemplary embodiment, the electronic element 90 is a processor. A plurality of component holes 91 is defined in the circuit board 100 corresponding to the electronic element 90. The component holes 91 have the same structure as the first vias 30, and each component hole 91 includes a third through hole 911 and a third conductive inner wall 913 plated on an inner surface of the third through hole 911. Pins (not shown) of the electronic element 90 can be received in the component holes 91, and electrically connects to the third conductive inner wall 913. So that he electronic element 90 can electrically connect to the conductive layers 10 via the component holes 91. Therefore, both the first portion of the current flowing through the inner conductive layers 10 and the second portion of the current flowing through the surface conductive layer 10 are converged at the component holes 91 on the surface conductive layer 10, and input into the electronic element 90 through the component holes 91 on the surface conductive layer 10.

The groups of the first vias 30 arranged surrounding each power supply element 40 have a regular distribution, to distribute current from the supply element 70 to each conductive layer 10, and the second vias 50 are arranged to adjust current transmitting on each conductive layer 10 during transmission. Thus, the circuit board 100 can have even current distribution. In addition, because each first via 30 is effectively used, the second vias 50 are only arranged along the peripheral edge of the conductive portion 13, the total number of the first vias 30 and the second vias 50 can be reduced to obtain higher current transmission efficiency and lower transmission lost.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A circuit board, comprising:
a plurality of conductive layers positioned spacedly and parallels, each conductive layer comprising a conductive portion;
at least one electronic element electronically connecting to the conductive portion on the surface;
at least one power supply element electronically connecting to the conductive portion on the surface;
at least one group of first vias defined through all the conductive layers, and electrically connecting each conductive portion, each group of the first vias surrounding a power supply element of the circuit board, configured to distribute current from the power supply element to each conductive layer; and
a plurality of second vias defined through all the conductive layers, and electrically connecting each conductive portion, the second vias being positioned between the power supply element and the electronic element, and arranged along the peripheral edge of the conductive portion, the second vias configured for guiding current of each conductive layer to flow to a conductive layer having a lower resistance and to the at least one electronic element, wherein the first portion of the current flowing through the inner conductive layers and the second portion of the current flowing through the surface conductive layer are converged at the component holes on the surface conductive layer and input into the electronic element through the surface conductive layer.

2. The circuit board of claim 1, wherein the conductive layer futher comprises at least one current flowing region formed by a group of first vias, the current is output into the current flowing region on the surface conductive layer, and a first portion of the current flows to the inner conductive layers through the group of first vias, a second portion of the current flows across the current flowing region and flows on the surface of conductive layer.

3. The circuit board of claim 2, wherein the current flowing region is rectangular.

4. The circuit board of claim 2, further comprising a plurality of element holes defined in the conductive layers corresponding to the electronic element, wherein the electronic element is electrically connected to the conductive layers via the component holes.

5. The circuit board of claim 1, wherein the conductive layers are signal layers or power supply layers.

6. The circuit board of claim 1, wherein the conductive layers are copper foil layers.

7. The circuit board of claim 1, wherein the electronic element is a processor.

8. The circuit board of claim 1, wherein each first via comprises a first through hole and a first conductive inner wall plated on the first through hole, the first through hole extends through all the conductive portion, the first conductive inner wall electronically connects to each conductive portion.

9. The circuit board of claim 1, wherein each second via comprises a second through hole and a second conductive inner wall plated on the second through hole, the second through hole extends through all the conductive portion, the second conductive inner wall electronically connects to each conductive portion.

* * * * *